US008722533B2

(12) United States Patent
Hong

(10) Patent No.: US 8,722,533 B2
(45) Date of Patent: May 13, 2014

(54) SEMICONDUCTOR DEVICE AND MANUFACTURING METHOD THEREOF

(75) Inventor: Zhongshan Hong, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 58 days.

(21) Appl. No.: 13/398,834

(22) Filed: Feb. 16, 2012

(65) Prior Publication Data

US 2012/0273851 A1     Nov. 1, 2012

(30) Foreign Application Priority Data

Apr. 29, 2011    (CN) .......................... 2011 1 0109821

(51) Int. Cl.
    *H01L 29/772*     (2006.01)
(52) U.S. Cl.
    USPC ........... 438/653; 438/618; 438/637; 438/667; 438/668; 257/E21.584
(58) Field of Classification Search
    USPC .......................... 438/653, 618, 637, 667, 668; 257/E21.584
See application file for complete search history.

(56) References Cited

U.S. PATENT DOCUMENTS

2004/0127023 A1    7/2004   Chun
2007/0155165 A1*   7/2007   Park et al. ..................... 438/629

FOREIGN PATENT DOCUMENTS

CN           1519925 A      8/2004

* cited by examiner

*Primary Examiner* — Minchul Yang
(74) *Attorney, Agent, or Firm* — Innovation Counsel LLP

(57) ABSTRACT

A manufacturing method of a semiconductor device includes forming a structure comprising an interlayer dielectric layer on a substrate, an ultra-low-k material layer on the interlayer dielectric layer and a plug. The plug passes through the interlayer dielectric layer and the ultra-low-k material layer, and is formed of a first metal material. The method further includes removing an upper portion of the plug by etching to form a recessed portion, and filling the recessed portion with a second metal material. According to the method, contact-hole photolithography is performed only once, and thus avoids alignment issues that may occur when contact-hole photolithography needs to be performed twice.

14 Claims, 7 Drawing Sheets

SEMICONDUCTOR DEVICE AND MANUFACTURING METHOD THEREOF

CROSS-REFERENCES TO RELATED APPLICATIONS

This application claims priority to Chinese Patent Application No. 201110109821.5, filed on Apr. 29, 2011 entitled "Semiconductor Device and Manufacturing Method Thereof", which is incorporated herein by reference in its entirety.

BACKGROUND OF THE INVENTION

1. Field of the Invention

The present invention relates to semiconductor manufacturing techniques, and more specifically, relates to a semiconductor device and a manufacturing method thereof.

2. Description of the Related Art

With the improvement of semiconductor manufacturing techniques, critical dimensions of a semiconductor device continue to scale down. In such cases, characteristics (e.g., contact resistance) of a contact has a great impact on device performance (such as, drive current Ion degradation).

When metals are used for forming a contact plug between metal wiring layers, it is necessary to select metal materials according to actual requirements, since each metal may have its own advantages and disadvantages. However, if two kinds of metals are properly used in combination, their respective disadvantages may be avoided while the advantages are further enhanced, so that better performance can be obtained.

The present invention uses commonly-used metals (i.e., tungsten and copper) as examples for the following description.

When conventional tungsten (W) is used to form a contact plug, an disadvantage of tungsten is its relatively high resistivity. Much work has been done to improve tungsten plug technology in order to reduce contact resistance (Rc). An example is to decrease the thickness of a barrier metal on the sidewall of a contact hole. Also, the resistivity of the filled tungsten can be reduced by controlling the characteristics of a nucleation layer deposited using $WF_6$ and $B_2H_6$ by an atomic layer deposition (ALD) technology. However, the resistivity of tungsten is still much higher than the resistivity of other metals like copper, silver or aluminum.

When copper (Cu) is used to form a contact plug, some issues may arise. One is Cu diffusion that may occur in silicon and oxide, and once Cu diffuses into regions such as a channel region, it will have an adverse impact on device performance. The other is voids formed in a copper contact plug when a Back-End-Of-Line (BEOL) Cu process is used to fill a contact hole of high aspect ratio will increase the contact resistance of the contact plug.

However, if a relatively short lower portion of the contact hole is filled with tungsten while an upper portion of the contact hole is filled with copper, the resistance of the entire contact plug can be reduced, and at the same time, filling a contact hole of high aspect ratio entirely with copper can be avoided, thus preventing Cu from diffusing into a channel region.

Likewise, as for other metals, if one metal is suitable for filling an upper portion of a contact hole but not its lower portion while another metal is suitable for filling the lower portion but not the upper portion according to design requirements of an integrated circuit device, it will be beneficial to fill the upper portion and the lower portion of the contact hole with two metals.

Taking tungsten and copper as examples, a conventional method for forming a contact plugs by combining two different kinds of metals reads as follows.

As shown in FIG. 1, short W contacts 120 are formed in openings of a first dielectric layer (for example, an interlayer dielectric layer (ILD)) 110 on a substrate 100.

Then, as shown in FIG. 2, a second dielectric layer (for example, an ultra-low-k layer (ULK)) 130 is deposited. A dual damascene process is performed to form an upper Cu contact 140 and first layer of metal connecting lines 150.

However, the conventional method requires contact-hole photolithography to be performed twice that has issues of position alignment and high cost.

Therefore, a more convenient and simpler method for forming a contact plug by employing two kinds of metals to respectively fill an upper portion and a lower portion of a contact hole is desirable.

BRIEF SUMMARY OF THE INVENTION

Embodiments of the present invention provide a more convenient and simpler method for forming a contact plug by filling an upper portion and a lower portion of a contact hole using two different kinds of metals.

According to one embodiment of the present invention, a method for manufacturing a semiconductor device includes forming a structure comprising an interlayer dielectric layer, an ultra-low-k material layer and a plug, the ultra-low-k material layer is disposed on the interlayer dielectric layer, the plug passes through the interlayer dielectric layer and the ultra-low-k material layer, and the plug is formed of a first metal material. The method further includes removing an upper portion of the plug by etching, so as to form a recessed portion, and depositing a second metal material to fill the recessed portion.

In one embodiment, the first metal material can be tungsten, and the second metal material can be selected from one of copper, aluminum, and silver.

In one embodiment, the step of removing the upper portion of the plug is performed by a dry etch process using $SF_6$.

In one embodiment, a bottom of the recessed portion can be either above or below the interface between the interlayer dielectric layer and the ultra-low-k material layer.

In one embodiment, the method can further comprise the following steps: forming a hard mask layer over the ultra-low-k material layer, forming a pattern for connecting lines in the hard mask layer, the pattern exposing the plug, and removing a portion of the ultra-low-k material layer using the pattern of the hard mask layer as a mask, so as to form a trench in the ultra-low-k material layer.

In one embodiment, the trench can be formed before the step of depositing the second metal material and the deposited second metal material fills the trench.

In one embodiment, the trench can be formed after the step of depositing the second metal material, and accordingly, the method further comprises depositing a third metal material to fill the trench. In one embodiment, the third metal material can be selected from one of copper, aluminum, and silver.

In one embodiment, the hard mask layer can be a metal contained layer containing at least one of Ti, TiN, Ta, and TaN. In one embodiment, the hard mask layer can have a thickness ranging from 50 Å to 300 Å.

In one embodiment, the method can further comprise performing a chemical mechanical polishing (CMP) process to expose an upper surface of the ultra-low-k material layer.

In one embodiment, the formed structure can further comprise a cap layer over the ultra-low-k material layer, and the cap layer is removed during the CMP process. In one embodiment, the material of the cap layer can be selected from one of TEOS, SiN, SiON, and nitrogen-doped silicon carbide (NDC). In one embodiment, the cap layer has a thickness ranging from 50 Å to 300 Å.

In one embodiment, a source region and a drain region are formed in the substrate, a gate is formed on the substrate, and the bottom of the plug couples to the source region, the drain region, or the gate.

In one embodiment, the above structure can further comprise a first diffusion barrier layer on the bottom and the sidewall of the plug, and the method further comprises, before the step of depositing the second metal material, removing a portion of the first diffusion barrier layer that is on the sidewall of the recessed portion, and depositing a second diffusion barrier layer on the bottom and a sidewall of the recessed portion.

According to another embodiment of the present invention, a semiconductor device includes an interlayer dielectric layer, an ultra-low-k material layer on the interlayer dielectric layer, and a contact plug that passes through the interlayer dielectric layer and the ultra-low-k material layer. The contact plug includes a lower portion formed of a first metal material and an upper portion formed of a second metal material, wherein the interface between the first metal material and the second metal material is either above or below the interface between the ultra-low-k material layer and the interlayer dielectric layer.

In one embodiment, the semiconductor device can further comprise a gate, a source region and a drain region, the bottom of the contact plug couples to the source region, the drain region, or the gate.

In one embodiment, the semiconductor device can further comprise connecting lines disposed in the ultra-low-k material layer, and the connecting lines can be formed of a third metal material and electrically couple to the upper portion of the contact plug.

In one embodiment, the first metal material can be tungsten, and the second and third metal materials each can be selected from one of copper, aluminum, and silver.

In one embodiment, the semiconductor device can further comprise a first diffusion barrier layer disposed on the bottom and the sidewall of the lower portion that is filled with the first metal material, and a second diffusion barrier layer disposed on the bottom and the sidewall of the upper portion that is filled with the second metal material.

According to a method of the present invention, contact-hole photolithography only needs to be performed once. Therefore, the alignment issue that arises when contact-hole photolithography needs to be performed twice will not occur, and the production cost can thus be reduced.

BRIEF DESCRIPTION OF THE DRAWINGS

The accompanying drawings, which are incorporated in and constitute a part of the specification, illustrate embodiments of the invention and, together with the description, serve to explain the principles of the invention.

Note that, in the drawings, for the convenience of description, the size for each component is not necessarily drawn to scale.

DETAILED DESCRIPTION OF THE INVENTION

A method for manufacturing a semiconductor device according to one embodiment of the present invention and the semiconductor device manufactured thereby will be described in detail with reference to the drawings.

Figure 3:
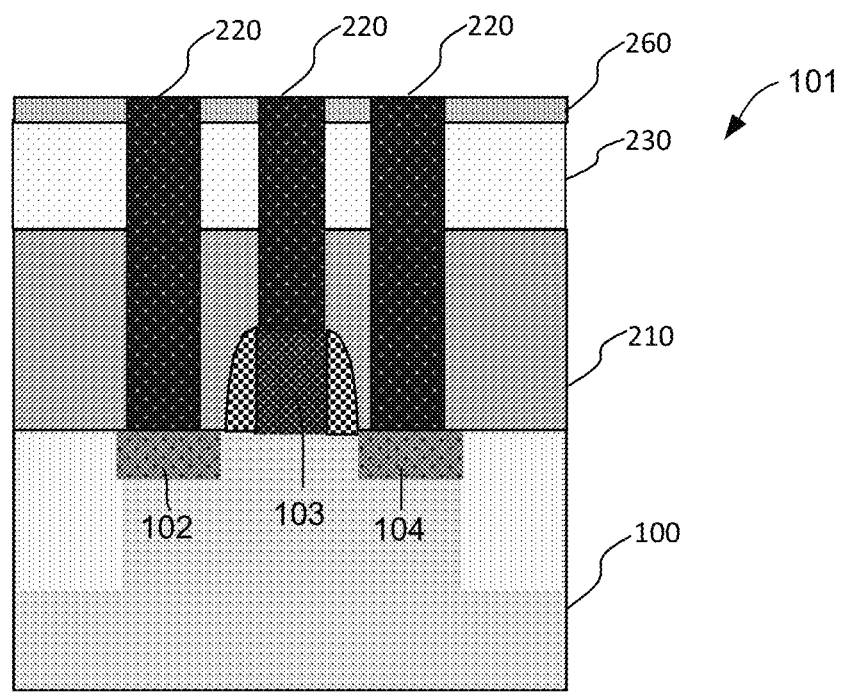
FIG. 3 is a cross-sectional diagram showing an initial structure of a method for manufacturing a semiconductor device according to an embodiment of the present invention, wherein a plug passes through an interlayer dielectric layer, an ultra-low-k material layer and a cap layer.

As shown in FIG. 3, a structure 101 comprising an interlayer dielectric layer (hereinafter abbreviated as "ILD") 210, an ultra-low-k material layer (hereinafter abbreviated as "ULK") 230 and a plug 220 is formed. Ultra-low-k dielectrics are defined as having a dielectric constant k of 2.7 or less.

ULK 230 is disposed on ILD 210, and ILD 210 is disposed on a substrate 100. The materials of ULK 230 and ILD 210 are known by one of ordinary skill in the relevant art. For example, ILD 210 can be formed of silicon oxide, and ULK 230 can be formed of porous SiCOH or porous macromolecule materials.

In one embodiment, a first cap layer 260 may be formed on ULK 230, so as to prevent ULK 230 from being damaged during a subsequent chemical mechanical polishing process. The material of the first cap layer 260 can be tetraethyl orthosilicate (TEOS), SiN, SiON, or nitrogen-doped silicon carbide (NDC). The first cap layer can have a thickness ranging from 50 Å to 300 Å.

The plug 220 passes through ILD 210, ULK 230 and the first cap layer 260 (if the cap layer is present). In FIG. 3, the lower portion of the plug 220 couples to a source region 102, a drain region 103 and a gate 104, respectively. In an embodiment, the bottom of the plug 220 may have direct contact with the source, the drain, or the gate. In another embodiment, the lower portion of the plug 220 can also connect metal connecting lines on adjacent layers.

The plug 220 is formed of a first metal material, which is suitable for being formed at a lower portion of a contact and has metal atoms that do not substantially diffuse into a semiconductor material (especially, a channel region). For example, the first metal material can be tungsten.

The bottom and the sidewall of the plug 220 can have a first diffusion barrier layer (not shown). The material of the first diffusion barrier layer can be formed of Ta/TaN, Ru, Ru/Ta/TaN, or Ti/TiN. The term "Ta/TaN" means a combination of Ta and TaN layers. The term "Ru/Ta/TaN" means a combination of Ru, Ta, and TaN layers. Similarly, the term "Ti/TiN" includes a combination of Ti and TiN layers.

Figure 4:
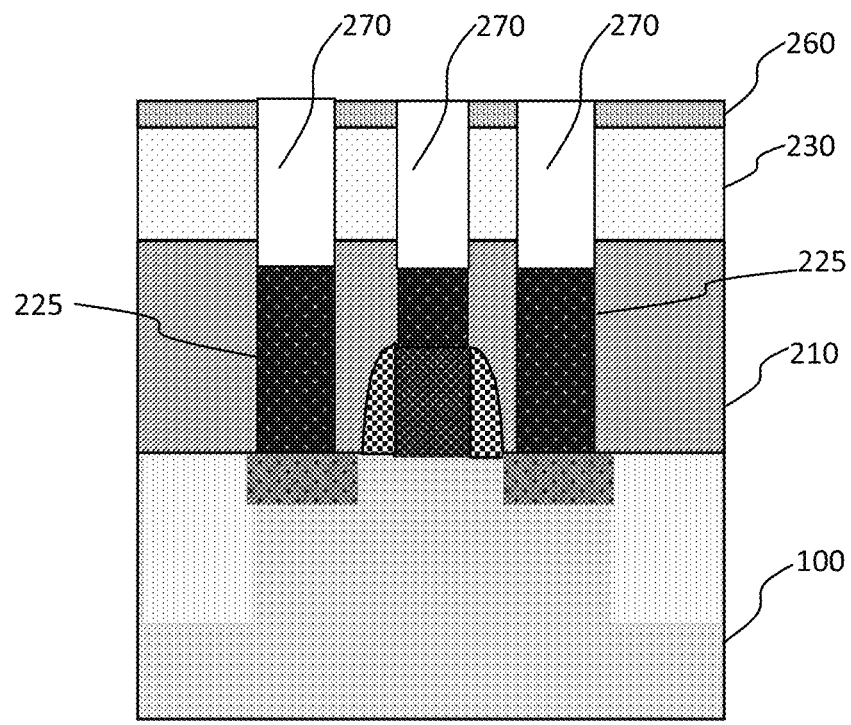
FIG. 4 is a cross-sectional diagram showing a structure after removing a portion of the plug shown in FIG. 3 by etching.

Next, as shown in FIG. 4, an upper portion of the plug 220 is removed by etching to form a recessed portion 270, while a lower portion of the plug 220 is maintained to serve as a lower portion 225 of the contact. In an embodiment, the plug 220 can be etched by a dry etch process using $SF_6$. In the case where a first diffusion barrier layer is present, a portion of the first diffusion barrier layer that is on the sidewall of the recessed portion 270 is etched as well. The bottom of the recessed portion 270 (i.e., the bottom of the second metal material) can be either above or below the interface between ILD 210 and ULK 230. This height difference is not a process tolerance caused by the difference of materials when performing processes like planarization on the entire upper surface, but is created by performing a etch process separately on one material. Thus, this height difference can be obvious, that is, the bottom of the recessed portion 270 (i.e., the bottom of the second metal material) can be obviously above or below the interface between ILD 210 and ULK 230).

Figure 5:
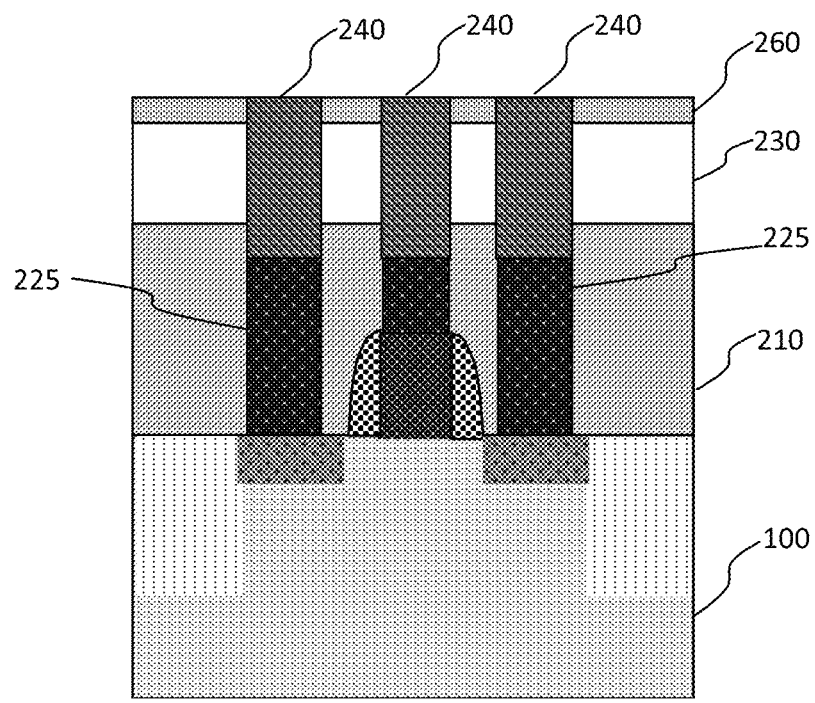
FIG. 5 is a cross-sectional diagram showing a structure after filling the recessed portion shown in FIG. 4 with a second metal material.

Then, as shown in FIG. 5, the second metal material is deposited to fill the recessed portion 270, so as to form an upper portion 240 of the contact. Before depositing the second metal material, a second diffusion barrier layer (not shown in the figure) can be formed. The second diffusion barrier layer can be formed of Ta/TaN, Ru, or Ru/Ta/TaN.

The second metal material can be a metal suitable for being formed at an upper portion of a contact and has an advantage of lower resistivity, for example. The second metal material can be copper, silver or aluminum, in an example embodiment.

As such, a contact with its lower portion formed of the first metal material and its upper portion formed of the second metal material is formed. Thus, advantages of two metals can be combined to improve the characteristics of the contact plug, while the adverse impacts due to their respective disadvantages can be mitigated.

Referring still to FIG. 5, the semiconductor device formed using the aforementioned method has ILD 210 and ULK 230 on the ILD 210 (the first cap layer 260 can be removed after CMP). The contact plug that passes through ILD 210 and ULK 230 can be formed of two metals. The lower portion 225 of the contact is formed of the first metal material. The upper portion 240 of the contact is formed of the second metal material.

Figure 1:
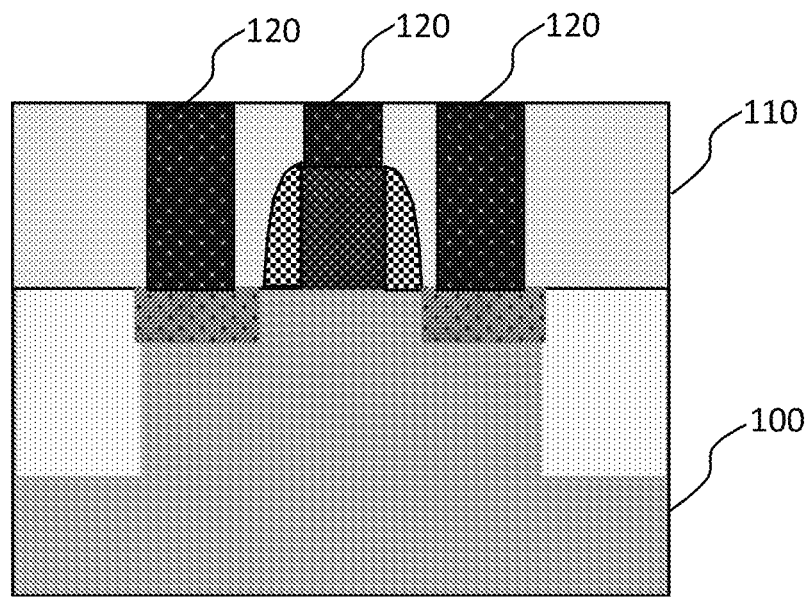
FIG. 1 is a cross-sectional diagram showing a semiconductor device structure with a short W contact formed in a first dielectric layer, as known in the prior art.
Figure 2:
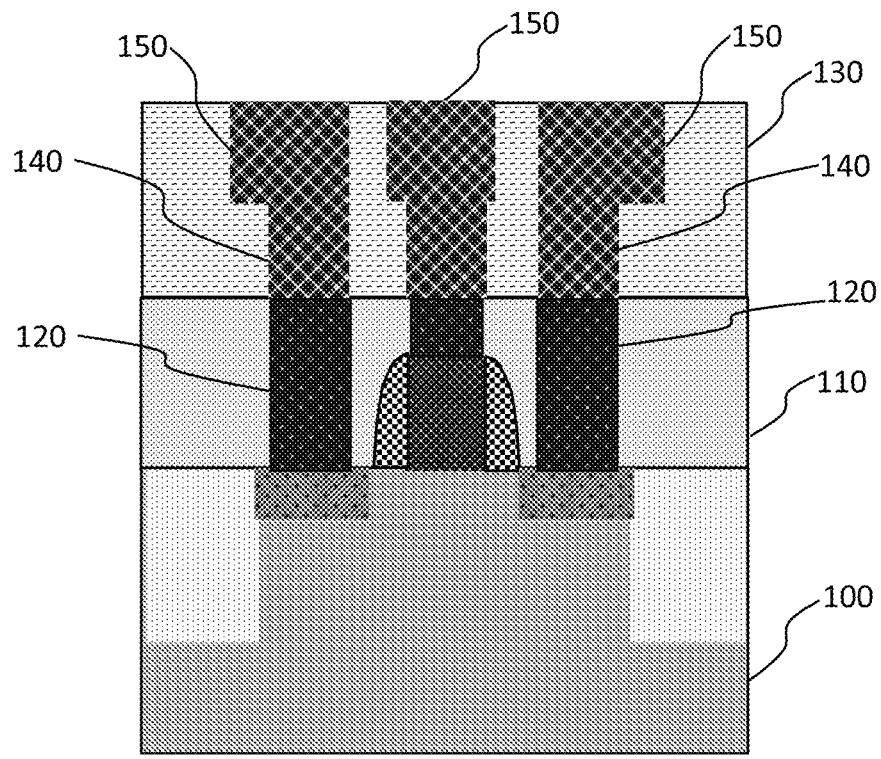
FIG. 2 is a cross-sectional diagram showing a semiconductor device structure obtained by performing a dual damascene process in a second dielectric layer on the basis of the structure shown in FIG. 1.

Since the plug 220 that passes through ILD 210 and ULK 230 is partially etched so as to be filled with the second metal material, the interface between the first metal material and the second metal material is generally not flush (coplanar) with the interface between ULK 230 and ILD 210, i.e., it can be above or below the interface between ULK 230 and ILD 210. This is different from the conventional structure described with reference to FIG. 2.

In FIG. 5, each of the bottoms of the contact plugs is shown as coupling to the source region, the drain region and the gate. In other embodiments, the bottoms of the contact plugs can also couple to metal lines in another layer so that the plugs can electrically connect metal lines disposed on different layers.

As described above, the bottom and the sidewall of the lower portion filled with the first metal material can have a first diffusion barrier layer, and the bottom and the sidewall of the upper portion filled with the second metal material can have a second diffusion barrier layer.

When the first metal material is tungsten and the second metal material is copper in a plug, it is beneficial to replace a portion of tungsten with copper to reduce its contact resistance. Meanwhile, since copper in the upper portion of the contact plug is away from the substrate, it will not diffuse into the channel region. Moreover, the depth-width ratio of the plug filled with copper is relatively low and thus voids formed in the copper can be avoided.

Figure 6:
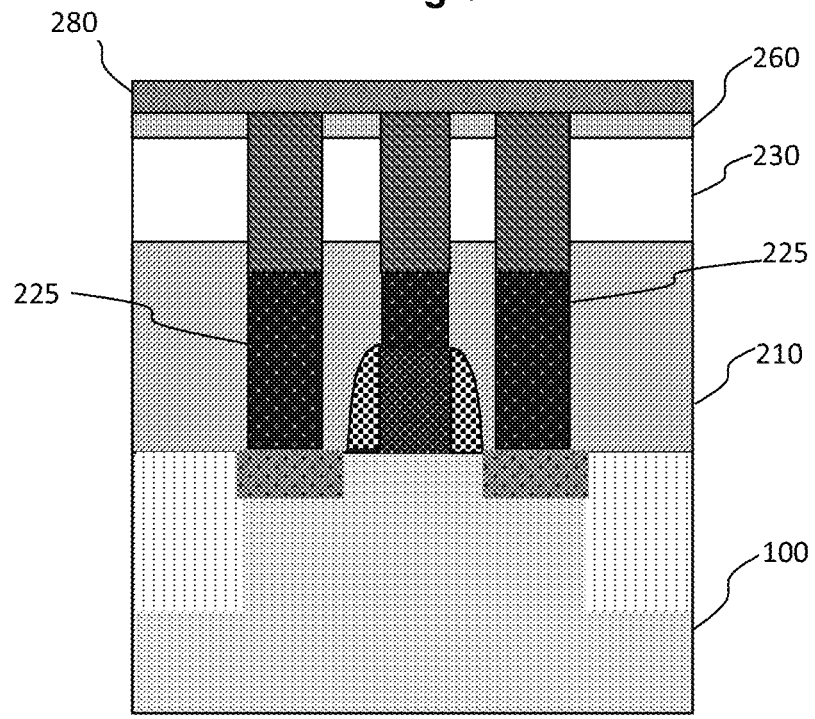
FIG. 6 is a cross-sectional diagram showing a structure with a hard mask layer formed on the structure shown in FIG. 5.

Next, the step of forming connecting lines is described. In an example embodiment, as shown in FIG. 6, a hard mask layer 280 is formed on ULK 230 (on the first cap layer 260 if it is present). The hard mask layer 280 can include a metal. In an embodiment, the hard mask layer includes at least one of Ti, TiN, Ta, and TaN. The hard mask layer 280 can have a thickness ranging from 50 Å to 300 Å.

In an embodiment, a second cap layer (not shown) may be formed over the hard mask layer 280. The second cap layer can be formed of tetraethyl orthosilicate (TEOS), SiN, SiON, or nitrogen-doped silicon carbide (NDC). The second cap layer can have a thickness ranging from 50 Å to 300 Å.

Figure 7:
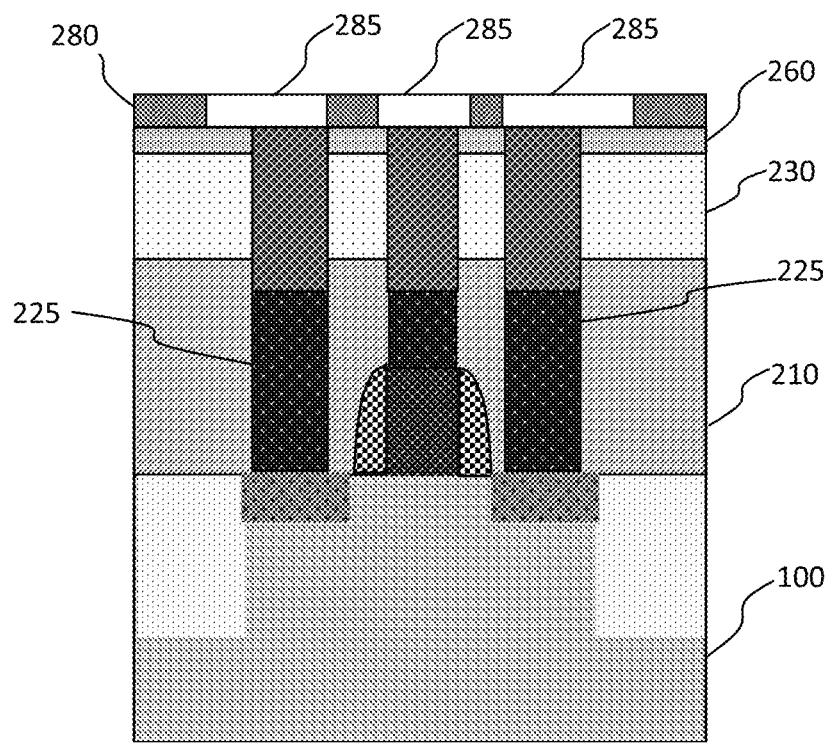
FIG. 7 is a cross-sectional diagram showing a structure with a pattern for connecting lines formed in the hard mask layer shown in FIG. 6.

Then, as shown in FIG. 7, a pattern for connecting lines 285 can be formed in the hard mask layer 280 by way of photolithography.

It should be understood that, the steps of depositing the hard mask layer 280 and forming the pattern for connecting lines 285 described above can be performed before removing the upper portion of the plug 220 by etching as shown in FIG. 4. As long as the pattern for connecting lines 285 is formed such that the plug 220 is exposed, etching of plug 220 will not be affected.

Alternatively, the steps of depositing the hard mask layer 280 and forming the pattern for connecting lines 285 described above can be performed after the steps shown in FIG. 4 and before depositing the second metal material to fill the recessed portion 270 as shown in FIG. 5. For example, the recessed portion 270 can be filled with a sacrificial material, the hard mask layer 280 is deposited after surface planarization, and the pattern for connecting lines 285 is formed. Then, the sacrificial material is removed.

Figure 8:
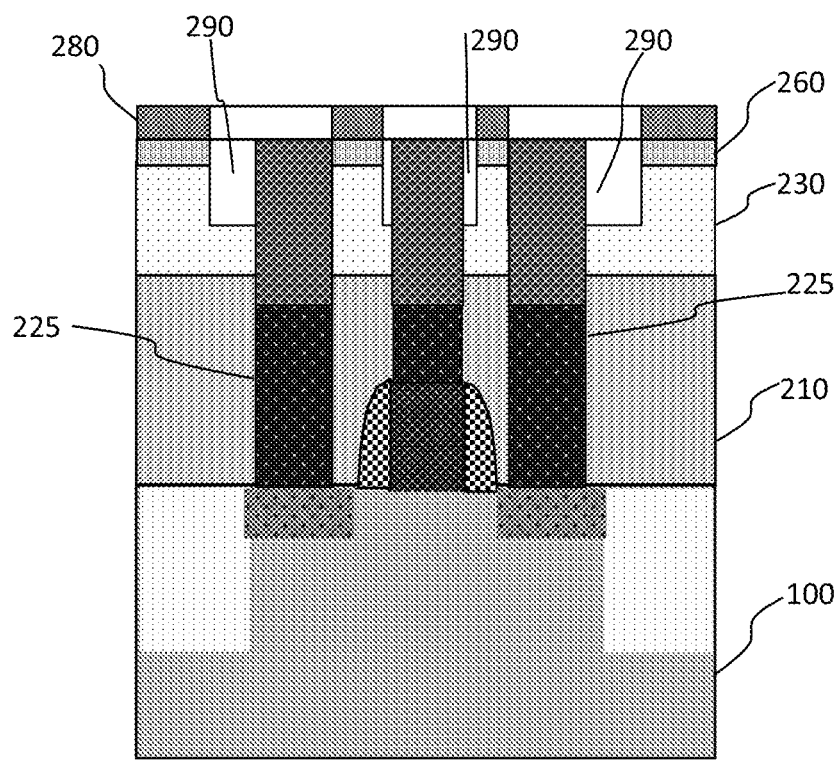
FIG. 8 is a cross-sectional diagram showing a structure with a trench formed in the ultra-low-k material layer shown in FIG. 7.

Next, as shown in FIG. 8, a portion of ULK 230 is removed using the pattern of the hard mask layer 280 as a mask, so as to form a trench 290 in ULK 230.

It should be understood that, the steps of forming the trench 290 described above can be performed before the steps shown in FIG. 4. That is, a portion of ULK 230 is first removed, and then a portion of the plug 220 is removed.

Alternatively, the step of forming the trench 290 described above can be performed after the step shown in FIG. 4 and before the step shown in FIG. 5. That is, a portion of the plug 220 is first removed, and then a portion of ULK 230 is removed.

As described above, the aforementioned steps of forming the trench 290 can be independent from the steps of removing a portion of the plug 220 and then depositing the second metal, the order of which are exchangeable as long as the former steps do not negatively influence the latter steps.

In the case where the trench 209 is formed before depositing the second metal material, the second metal material also fills the trench 290 to form connecting lines. The case will be described below with reference to FIGS. 10 and 13.

Figure 9:
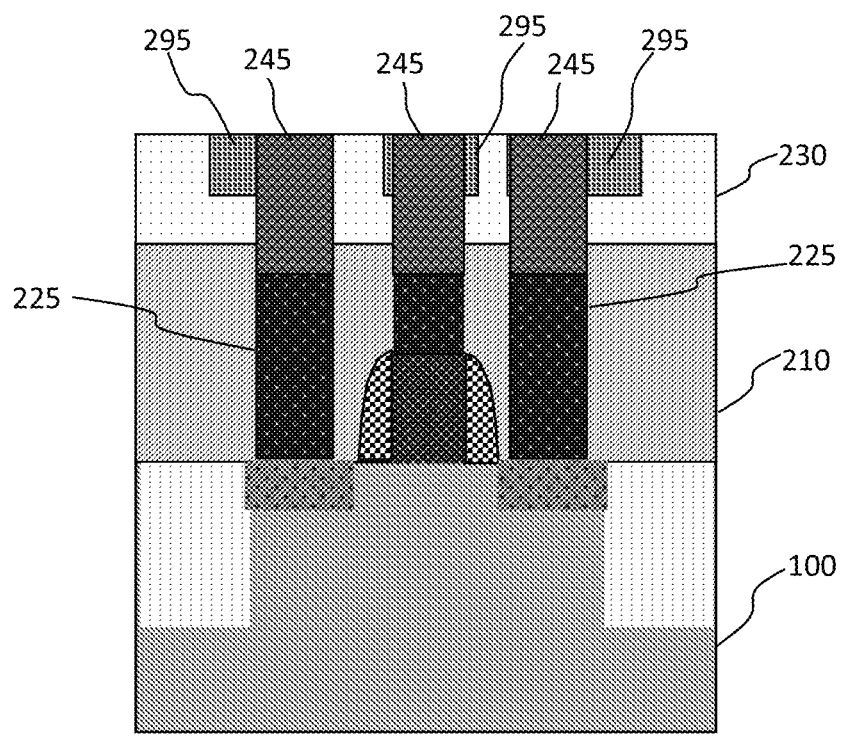
FIG. 9 is a cross-sectional diagram showing a structure after removing the hard mask layer and the cap layer from the structure shown in FIG. 8.

Alternatively, the trench 290 can be formed after depositing the second metal material and after removing the overflowed second metal material by a chemical mechanical polishing process. In this case, as shown in FIG. 9, a third metal material is deposited. A chemical mechanical polishing (CMP) process is performed so as to remove unnecessary third metal material and the hard mask layer 280 (and the first cap layer 260 and the second cap layer, if they are present), thereby exposing the upper surface of ULK 230.

Also, a portion of the plug 220 can be removed after depositing the third metal material and performing the chemical mechanical polishing process, and the second metal material is then deposited. As a result, the structure shown in FIG. 9 can be formed.

Compared to FIG. 5, in the semiconductor device shown in FIG. 9, connecting lines 295 formed of the third metal material in ULK 230 are further formed. The connecting lines 295 electrically couple to the upper portion 245 of the contact plug (in a case where there is a first cap 260 over ULK 230 as shown in FIG. 5, the first cap layer 260 is removed and a corresponding portion of the upper portion 240 of the contact is removed as well).

The third metal material can be the same as or different from the second metal material. The third metal material can be a metal that is suitable for being used as connecting lines, such as, copper, silver or aluminum.

As pointed out above, in the method disclosed in this application, the order of the steps related to the formation of the second metal material and the third metal material are interchangeable.

If the third metal material is the same as the second metal material, the second metal material is preferably deposited after removing a portion of the plug 220 by etching and forming the trench 290, thereby the upper portion of the contact and the connecting lines are formed simultaneously.

Figure 10:
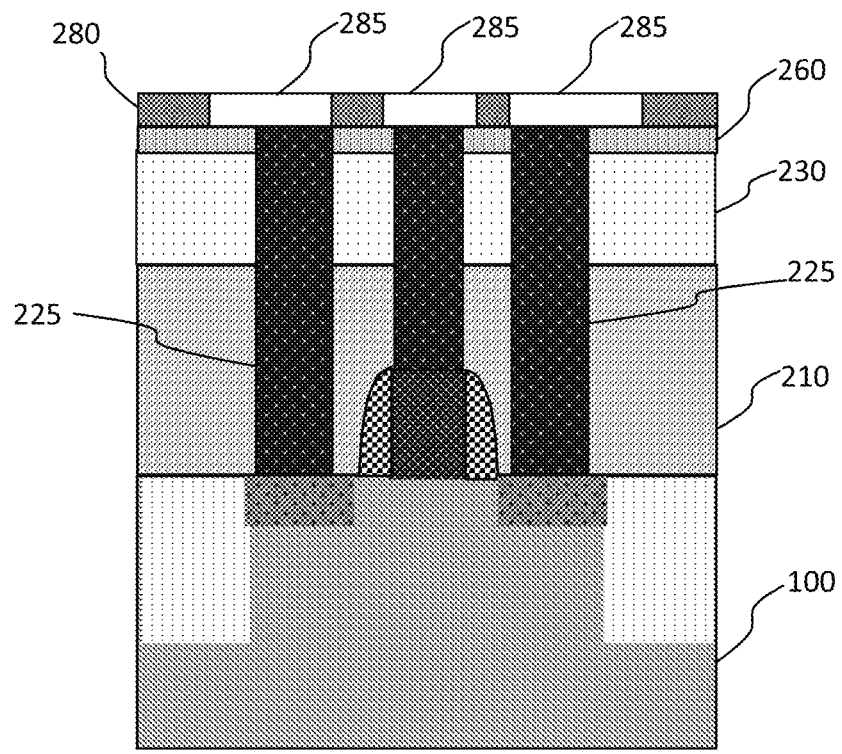
FIG. 10 is a cross-sectional diagram showing a structure with a hard mask layer having a pattern for connecting lines formed on the structure shown in FIG. 3 according to another embodiment.

Specifically, with reference to FIG. 10, on the basis of the structure shown in FIG. 3, the hard mask layer 280 is further formed. The hard mask layer 280 can include at least one of Ti, TiN, Ta, and TaN and have a thickness ranging from 50 Å to 300 Å.

In an embodiment, the second cap (not shown) can be formed on the hard mask layer 280. The second cap layer can be formed of TEOS, SiN, SiON, or nitrogen-doped silicon carbide (NDC). The second cap layer can have a thickness ranging from 50 Å to 300 Å.

The pattern for connecting lines 285 is formed in the hard mask layer 280 by way of, for example, photolithography. The pattern for connecting lines 285 exposes the plug 220.

Figure 11:
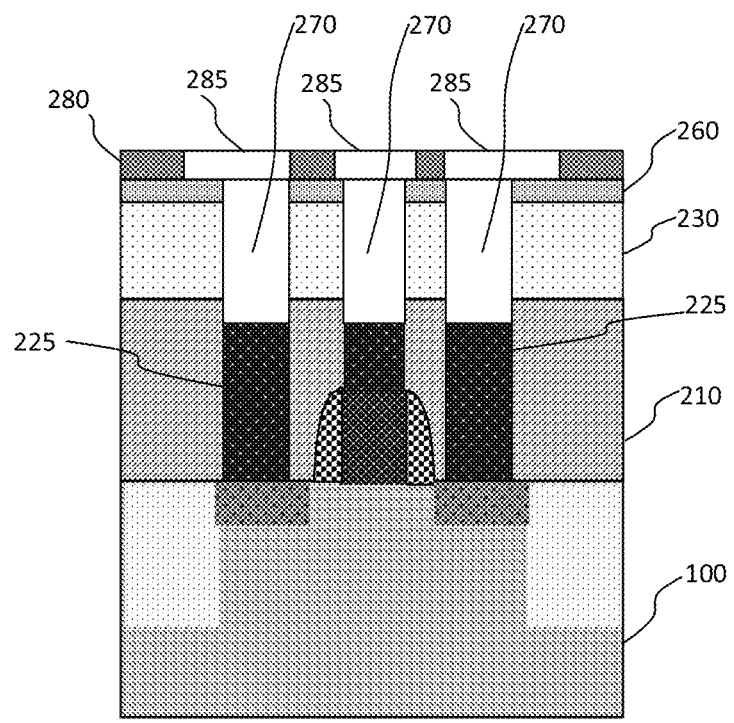
FIG. 11 is a cross-sectional diagram showing a structure after removing a portion of the plug in the structure shown in FIG. 10 by etching.

Next, as shown in FIG. 11, the upper portion of the plug 220 is removed by etching to form the recessed portion 270. Likewise, the plug 220 can be etched by a dry etch process using $SF_6$. If the first diffusion barrier layer is present, a portion of the first diffusion barrier layer that is on the sidewall of the recessed portion 270 is removed by etching as well.

Figure 12:
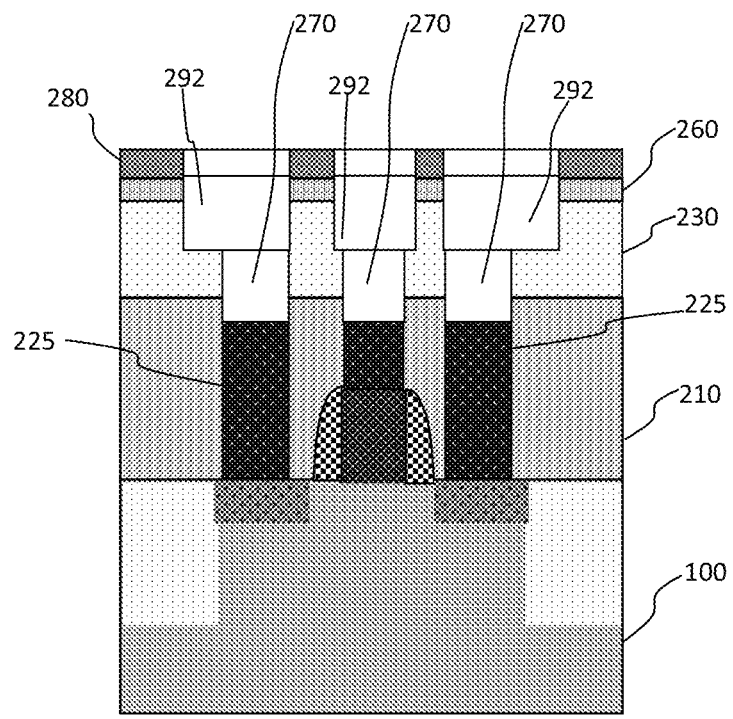
FIG. 12 is a cross-sectional diagram showing a structure with a trench formed in the ultra-low-k material layer shown in FIG. 11.

Next, as shown in FIG. 12, a portion of ULK 230 is removed using the pattern of the hard mask layer 280 as a mask, so as to form the trench 292 in ULK 230.

Figure 13:
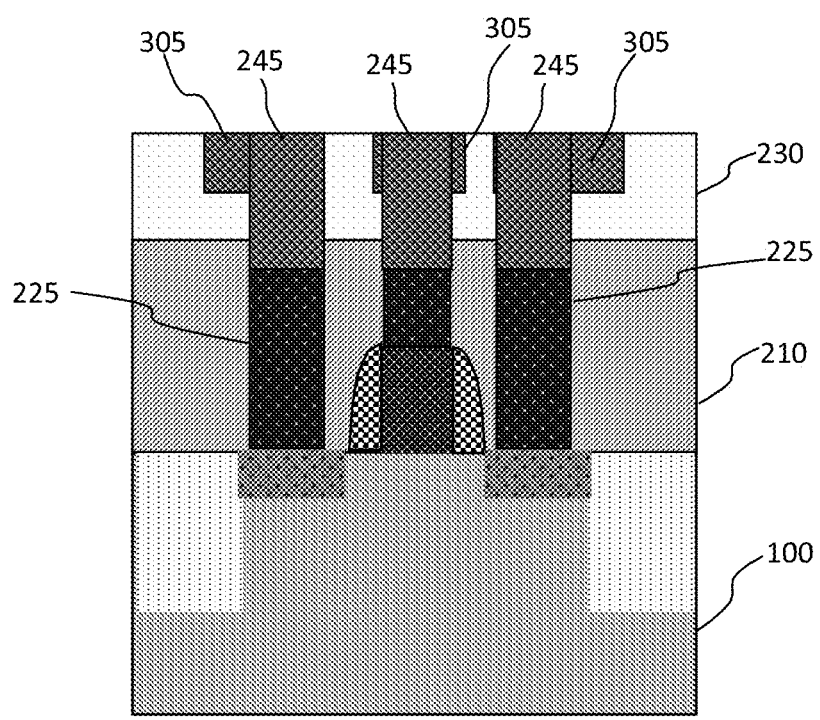
FIG. 13 is a cross-sectional diagram showing a structure after filling the recessed portion and the trench shown in FIG. 12 with a second metal material and removing the hard mask layer and the cap layer.

Then, as shown in FIG. 13, the second metal material is deposited to fill the recessed portion 270 and the trench 292.

A chemical mechanical polishing (CMP) process is performed to remove unnecessary second metal material and the hard mask layer 280 (and the first cap layer 260 and the second cap if present), thereby exposing the upper surface of ULK 230.

Similarly, the second diffusion barrier layer (not shown) can be formed before depositing the second metal material. The second diffusion barrier layer can be formed of Ta/TaN, Ru, or Ru/Ta/TaN.

As such, a contact plug with the lower portion 225 formed from the first metal material and the upper portion 245 formed from the second metal material is formed. Meanwhile, connecting lines 305 that are electrically connected to the contact plug and formed from the second metal material are formed. Thus, the advantages of the two metals are combined while adverse effects due to their respective disadvantages are avoided.

Same as the above description, the second metal material can be a metal suitable for being formed at an upper portion of a contact plug and has an advantage of lower resistivity, for example. The second metal material can be copper, silver or aluminum, in an example embodiment.

The semiconductor device shown in FIG. 13 differs from that shown in FIG. 9 in that the upper portion 245 of the contact and the connecting lines 305 are formed from the same metal material in FIG. 13.

So far, a method for manufacturing a semiconductor device according to the present invention as well as a semiconductor device formed thereby has been described in detail. In order not to obscure the concept of the present invention, some details known in the relevant art are not described. One of ordinary skill in the relevant art can clearly know how to implement the technical solution disclosed herein based on the above description.

The above statement is given merely for illustration and description, and is not exhaustive, or to limit the invention to the disclosed form. Many modifications and changes are obvious to one of ordinary skill in the relevant art. Embodiments are selected and described for a better illustration of the principle and practical application of this invention, so that those skilled in the art can understand this invention and envisage various embodiments with various modifications suited to specific usages.

What is claimed is:

1. A method for manufacturing a semiconductor device, the method comprising:
   forming a structure, said structure having an interlayer dielectric layer provided on a substrate, an ultra-low-k material layer provided on the interlayer dielectric layer, and a plug passing through said interlayer dielectric layer and said ultra-low-k material layer, said plug being formed of a first metal material;
   removing an upper portion of the plug by etching to form a recessed portion;
   depositing a second metal material to fill said recessed portion;
   forming a hard mask layer on said ultra-low-k material layer;
   forming a pattern for connecting lines in said hard mask layer, said pattern exposing said plug; and
   removing a portion of said ultra-low-k material layer using said pattern of said hard mask layer as a mask to form a trench in said ultra-low-k material layer.

2. The method according to claim 1, wherein said first metal material is tungsten, and said second metal material is selected from one of copper, aluminum, and silver.

3. The method according to claim 2, wherein the step of removing the upper portion of the plug is performed by a dry etch process using SF6.

4. The method according to claim 1, wherein a bottom of said recessed portion is either above or below an interface between said interlayer dielectric layer and said ultra-low-k material layer.

5. The method according to claim 1, wherein the trench is formed before depositing the second metal material and the deposited second metal material fills said trench.

6. The method according to claim 1 further comprising:
depositing a third metal material to fill said trench, wherein the trench is formed after depositing the second metal material.

7. The method according to claim 6, wherein said third metal material is selected from one of copper, aluminum, and silver.

8. The method according to claim 1, wherein said hard mask layer comprises at least one of Ti, TiN, Ta and TaN.

9. The method according to claim 1, wherein said hard mask layer has a thickness ranging from 50 Å to 300 Å.

10. The method according to claim 1 further comprising performing a chemical mechanical polishing process to expose an upper surface of said ultra-low-k material layer.

11. The method according to claim 10 further comprising forming a cap layer on said ultra-low-k material layer before performing said chemical mechanical polishing process.

12. The method according to claim 11, wherein said cap layer is formed of TEOS, SiN, SiON, or nitrogen-doped silicon carbide, and said cap layer has a thickness ranging from 50 Å to 300 Å.

13. The method according to claim 1, wherein a source region and a drain region are formed in said substrate, a gate is formed on said substrate, and a bottom of said plug couples to said source region, said drain region, or said gate.

14. The method according to claim 1 further comprising:
before depositing the second metal material, removing a portion of a first diffusion barrier layer being disposed on a sidewall of the recessed portion, wherein said first diffusion barrier layer is disposed on a bottom and a sidewall of the plug;
depositing a second diffusion barrier layer on a bottom and on a sidewall of the recessed portion.

* * * * *